(12) United States Patent
Boehler et al.

(10) Patent No.: US 6,950,971 B2
(45) Date of Patent: Sep. 27, 2005

(54) USING DATA COMPRESSION FOR FASTER TESTING OF EMBEDDED MEMORY

(75) Inventors: Thomas Boehler, Poughkeepsie, NY (US); Gunther Lehmann, Poughkeepsie, NY (US)

(73) Assignee: Infineon Technologies AG, Munich (DE)

(*) Notice: Subject to any disclaimer, the term of this patent is extended or adjusted under 35 U.S.C. 154(b) by 552 days.

(21) Appl. No.: 09/993,415

(22) Filed: Nov. 5, 2001

(65) Prior Publication Data

US 2003/0088815 A1 May 8, 2003

(51) Int. Cl.$^7$ .................. G11C 29/00; G11C 16/06
(52) U.S. Cl. ................. 714/710; 714/723; 365/185.09
(58) Field of Search .................. 714/710, 711, 714/718, 719, 723, 736, 824; 365/185.09, 201; 711/165

(56) References Cited

U.S. PATENT DOCUMENTS

| | | | | |
|---|---|---|---|---|
| 5,418,452 A | * | 5/1995 | Pyle | 324/158.1 |
| 6,163,863 A | * | 12/2000 | Schicht | 714/718 |
| 6,311,299 B1 | * | 10/2001 | Bunker | 714/719 |
| 6,374,378 B1 | * | 4/2002 | Takano et al. | 714/719 |
| 6,484,278 B1 | * | 11/2002 | Merritt et al. | 714/719 |
| 6,543,015 B1 | * | 4/2003 | Wang et al. | 714/718 |
| 6,564,346 B1 | * | 5/2003 | Vollrath et al. | 714/723 |

* cited by examiner

Primary Examiner—Albert Decady
Assistant Examiner—Cynthia Britt
(74) Attorney, Agent, or Firm—Brinks Hofer Gilson & Lione

(57) ABSTRACT

A memory apparatus is configured by obtaining test information for each of group of memory locations within the memory apparatus, compressing the test information to produced compressed test information and, based on the compressed test information, replacing a group of redundant memory circuits respectively associated with the group of memory locations.

24 Claims, 6 Drawing Sheets

FIG. 1
(PRIOR ART)

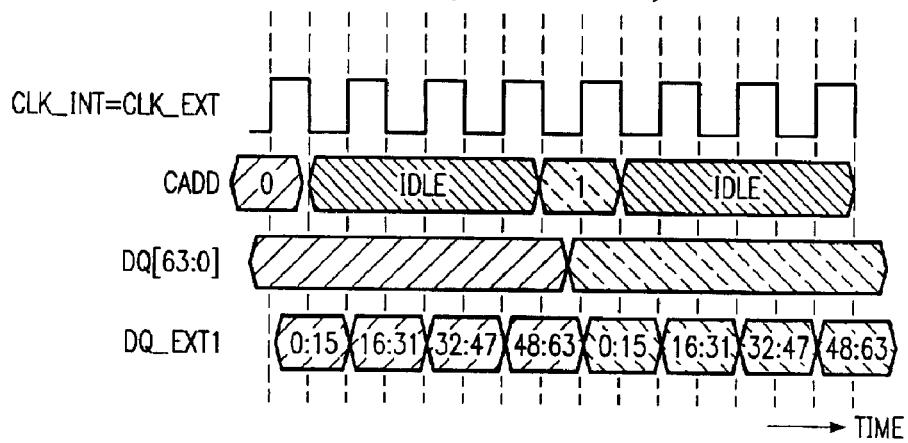

Data read sequence for a 64 bit data bus and a 16 bit wide external tester interface (internal clock frequency= external clock frequency). Note that between each read operation the eDRAM will stay for 3 cycles in idle mode.

FIG. 2
(PRIOR ART)

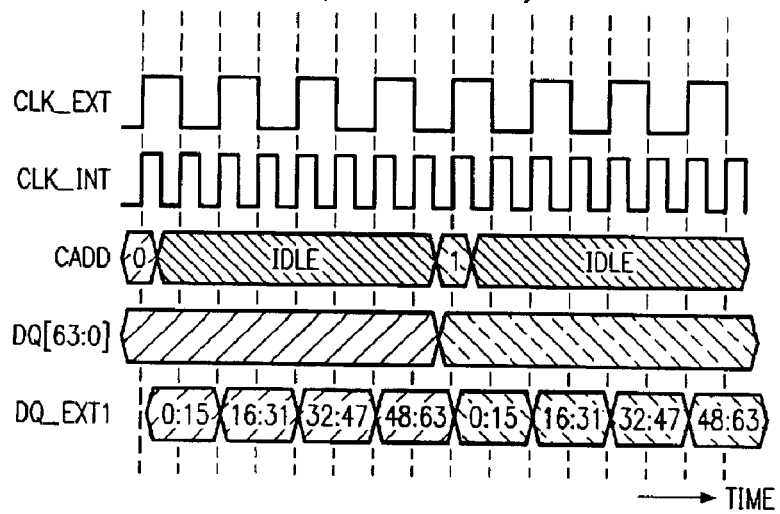

Data read sequence for a 64 bit data bus and a 16 bit wide external tester interface (internal clock frequency= 2x external clock frequency). Note that between each read operation the eDRAM will stay for 7 cycles in idle mode.

Data read sequence for a 64 bit data bus and a 16 bit wide external tester interface (internal clock frequency=2x external clock frequency). Note that the time for multiplexing the compressed data (from previous read cycles) to the tester is used to compress the current read data. No cycles are lost, 8 bit compression.

Data read sequence for a 64 bit data bus and a 16 bit wide external tester interface (internal clock frequency=external clock frequency). Note that the time for multiplexing the compressed data (from previous read cycles) to the tester is used to compress current read data. No cycles are lost, 4 bit compression.

USING DATA COMPRESSION FOR FASTER TESTING OF EMBEDDED MEMORY

FIELD OF THE INVENTION

The invention relates generally to integrated circuits with embedded memory and, more particularly, to testing the embedded memory.

BACKGROUND OF THE INVENTION

In order to achieve a fast product ramp up and a high yield, any standard memory, for example a standard DRAM or embedded DRAM circuit needs intensive testing. A DRAM typically includes redundant wordlines and bitlines, which can be used to repair defective wordlines and bitlines. Most conventional DRAM testing procedures are designed to find all possible storage cell failures. An external tester collects all of the detected failures into a so-called fail bit map. The external tester uses the fail bit map to determine the best use of the aforementioned on-chip redundancy to repair the detected defects.

The interface between an external tester and a DRAM chip (or a chip having an embedded DRAM) has two major limitations. One limitation is the maximum clock frequency that an external tester can apply to the chip, and the other limitation is the number of pins on the chip that are available for use by the external tester. When testing an embedded memory such as an embedded DRAM, the aforementioned pin limitation is the major problem. For example, today's technologies provide very large and wide embedded DRAMs (e.g. up to 32 Mb with a 256 bit data with). The testing of such embedded memory circuits is increasingly becoming the most significant cost driving factor in the total chip cost.

FIG. 1 illustrates a conventional example of testing a DRAM embedded within an integrated circuit, for example an application specific integrated circuit (ASIC). The example of FIG. 1 illustrates a 64 bit DRAM data bus and a 16 bit wide external tester interface. The timing diagram of FIG. 1 illustrates a sequence of read accesses of the embedded DRAM, simplified by only showing the column address (CADD) used to access the DRAM. As mentioned above, the embedded DRAM of the FIG. 1 example has a 64 bit data bus (designated as DQ[63:0]) and, in order to lower the number of pins required for external tester access, the internal 64 bit data bus is multiplexed onto a 16 bit external tester interface (DQ_EXT1[15:0]). Accordingly, four clock cycles of the internal DRAM clock (CLK_INT) are required for the external tester to read out all 64 data bits produced by a single read access of the embedded DRAM. Because the embedded DRAM needs only one cycle of CLK_INT to perform its 64 bit read access, the DRAM remains in an idle mode for the remaining three cycles of CLK_INT required for the external tester to read out all 64 bits.

Another conventional example is illustrated in FIG. 2. In the example of FIG. 2, the activity on the 64 bit DRAM data bus DQ and on the external tester interface DQ_EXT1 is the same as in FIG. 1. However, in the example of FIG. 2, the embedded DRAM remains in the idle state for seven cycles of CLK_INT, because the frequency of CLK_INT is twice that of the external tester clock CLK_EXT. In contrast, in the example of FIG. 1, the external tester clock CLK_EXT has the same frequency as the internal clock CLK_INT of the embedded DRAM. The example of FIG. 2 illustrates that the DRAM can easily operate internally at higher clock frequencies than the highest clock frequency which can be applied by the external tester, this latter external tester clock frequency being limited by factors such as wire, pad and probe needle parasitic (R, L, C). As shown in FIG. 2, even though the embedded DRAM can operate at twice the clock frequency of the external tester, the output data rate at DQ_EXT1 is still limited by the clock CLK_EXT of the external tester. The difference caused by the higher internal clock frequency of FIG. 2 is that the DRAM must remain in its idle mode for seven internal clock cycles between each read access cycle.

The 64-to-16 bit multiplexing and corresponding idle cycles illustrated in FIGS. 1 and 2 disadvantageously limit the speed with which memory testing can be accomplished. This is true whether the internal memory clock has the same frequency or a substantially higher frequency than the test interface clock.

It is therefore desirable to reduce the time required to test embedded memory circuits.

The present invention reduces the time required to test embedded memory circuits by identifying a group of locations within a memory, and compressing the failure information associated with those locations. If the compressed failure information indicates a failure associated with any one of the group of memory locations, then a group of redundant memory circuits respectively associated with the group of memory locations is replaced. Such use of compressed failure information advantageously provides a reduction in the time required for testing an embedded memory circuit.

BRIEF DESCRIPTION OF THE DRAWINGS

FIGS. 1 and 2 are timing diagrams which illustrate examples of conventional embedded memory circuit testing.

DETAILED DESCRIPTION

Figure 3:
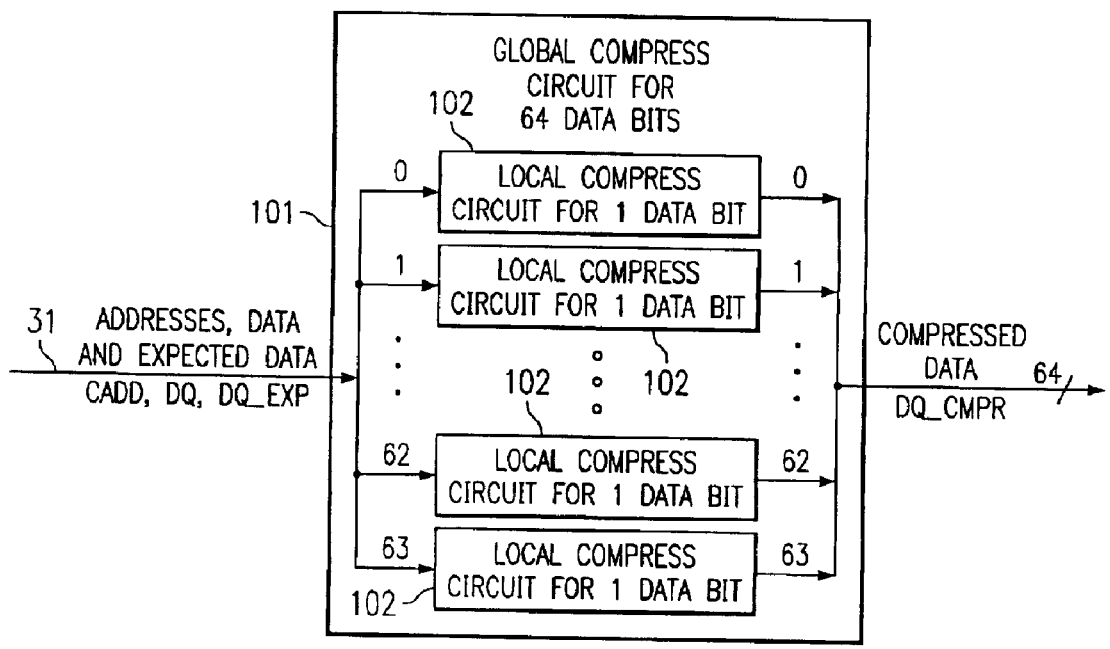
FIG. 3 diagrammatically illustrates exemplary embodiments of a global compression circuit for use in embedded memory testing according to the invention.

FIG. 3 diagrammatically illustrates exemplary embodiments of a global compression circuit 101 for use in embedded memory testing according to the invention. In the exemplary embodiments of FIG. 3, the global compression circuit 101 is coupled to an address bus and a data bus of a memory circuit, thereby to receive address information used by the memory circuit and data stored in the memory circuit. The global compression circuit 101 is also connected to receive expected data, which will be compared to the data received from the memory data bus. The aforementioned address, data and expected data information received by the global compression circuit 101 is indicated generally at 31 in FIG. 3.

In some embodiments, the memory data bus is 64 bits wide, so the circuit 101 can receive 64 data bits from the memory data bus. These 64 data bits can, for example, correspond to a 64-row×1 column portion of a memory array (for example a DRAM array) implemented by the memory circuit. Each of the 64 received data bits is input to a respective one of 64 local compression circuits 102, together with the corresponding expected data bit. Each local compression circuit 102 compares its received data bit with the corresponding expected data bit to produce a failure bit that is indicative of whether or not a failure has occurred for that particular memory cell. Each local compression circuit 102 stores the failure bit associated with the memory data bit that it has received. Thereafter each of the 64 local compression circuits 102 receives another memory data bit (e.g. from another 64 row×1 column portion adjacent to the 64 row×1 column portion from which the previous memory data was received) along with its corresponding expected data bit, whereupon the local compression circuit compares the memory data bit to the expected data bit to produce another failure bit which it stores in the same fashion as described above. The 64 local compression circuits 102 repeat this compare and store process for a predetermined number of sets of 64 data bits received from the memory, wherein each set of 64 data bits can be, as described above, a 64 row×1 column portion of the memory array.

Once the 64 local compression circuits 102 have performed the aforementioned data/expected data compare and failure bit storage operations for a desired number of sets of memory data bits (each set being, for example, a 64 row×1 column portion) received from the memory circuit, each local compression circuit 102 compresses the stored failure bits into a single bit. Thus, the global compression circuit 101 of FIG. 1 provides a 64 bit output that represents the test results for K×64 memory cells of the memory circuit, where K is the number of 64-bit sets of memory data (e.g. the number of columns) to which have been applied the aforementioned data/expected data compare and failure bit storage operations. Thus, the factor K represents the compression factor implemented by the global compression circuit 101.

Figure 4:
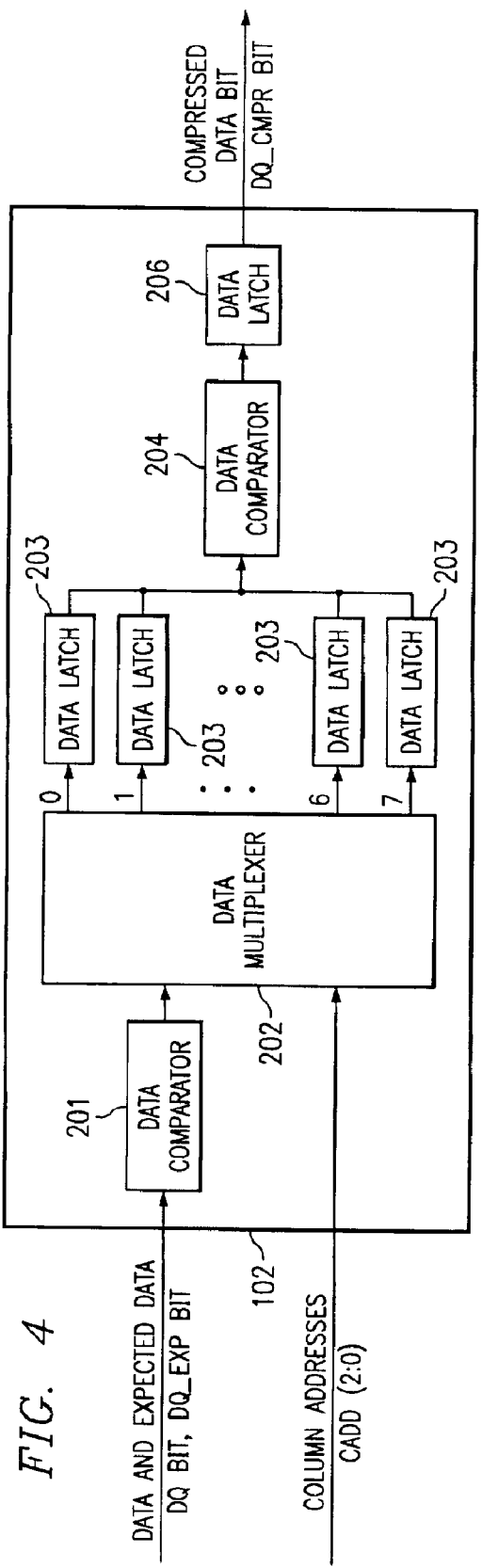
FIG. 4 diagrammatically illustrates exemplary embodiments of the local compression circuits of FIG. 3.

FIG. 4 diagrammatically illustrates exemplary embodiments of the local compression circuits 102 of FIG. 3. In FIG. 4, a data comparator 201 performs the aforementioned data/expected data comparison, and a data multiplexer 202 routes the comparison result to a selected one of a plurality of data latches 203 for storage in the selected data latch. In the embodiments illustrated in FIG. 4, the data multiplexer 202 is controlled by the least significant three column address bits (CADD (2:0)) of a DRAM. Thus, as the column address bits sequentially cycle through eight column addresses associated with eight adjacent columns of the memory array, eight data bits (from the respective eight columns) and their corresponding expected data bits are compared in a sequence of eight compare operations at 201, and the resulting eight comparison results (failure bits) are sequentially routed through the data multiplexer 202 into respective ones of the eight data latches illustrated at 203. Thus, FIG. 4 illustrates embodiments wherein the aforementioned compression factor K=8.

After the eight failure bits are stored in their data latches 203, these stored failure bits are then compared by a data comparator 204 to produce a final compressed bit which is then stored in a data latch 206. The data latch 206 thus stores a compressed data bit that represents test results for the eight data bits sequentially received at comparator 201 as the column address sequences through eight adjacent columns of the DRAM. Thus, in this example, each of the 64 data bits produced by the 64 local comparator circuits 102 of FIG. 3 represents compressed test results associated with eight different memory cells in eight adjacent columns of a single row of the memory array. Therefore, the 64 bits of compressed data output by the global compression circuit 101 of FIG. 1 represent, for example, the test results for 64 groups of eight adjacent memory cells (corresponding, for example, to the cells of a 64×8 portion of the memory array).

Figure 5:
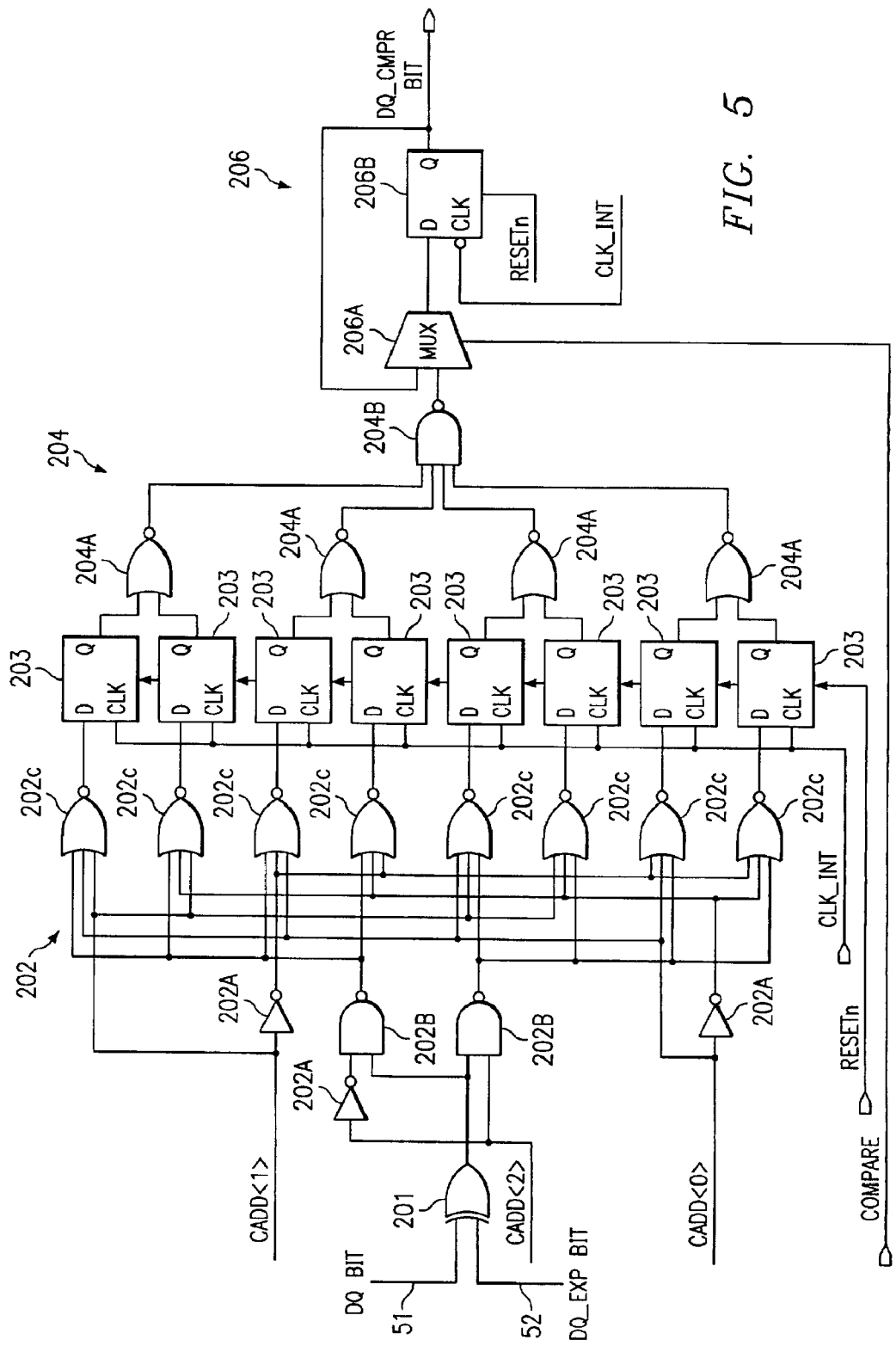
FIG. 5 diagrammatically illustrates an exemplary implementation of the local compression circuit of FIG. 4.

FIG. 5 diagrammatically illustrates an exemplary implementation of the local compression circuit 102 of FIGS. 3 and 4. In the embodiment of FIG. 5, the data comparator 201 is implemented as an exclusive-OR gate which receives the memory bit at 51 and the corresponding expected bit at 52. The data multiplexer 202 is implemented in FIG. 5 by inverters 202A, NAND gates 202B and NOR gates 202C interconnected as shown. The data latches 203 are implemented in FIG. 5 as D flip-flops whose D inputs are driven by the respective NOR gates 202C. The data comparator 204 is implemented in FIG. 5 by four two-input NOR gates 204A whose respective outputs drive the inputs of a NAND gate 204B (thereby forming an 8-input OR gate). Each NOR gate 204A is driven by the Q outputs of two of the D flip-flops 203. Any logic one stored in any flip-flop 203 (corresponding to a failure detected by exclusive-OR gate 201) will cause NAND gate 204B to output a logic one.

The data latch 206 is implemented in FIG. 5 by a multiplexer 206A having an output that drives the D input of a D flip-flop 206B. The multiplexer 206A has inputs driven respectively by the NAND gate 204B and the Q output of the flip-flop 206B. The Q output of the flip-flop 206B is the compressed data bit output of the local compression circuit 102. The multiplexer 206A is controlled by a COMPARE signal such that the Q output of flip-flop 206B is fed back to the D input of flip-flop 206B except when the COMPARE signal is active. While the COMPARE signal is active, the output of NAND gate 204B is applied to the D input of the flip-flop 206B. The flip-flops 203 and 206B of FIGURE are all clocked by the internal clock CLK_INT of the embedded memory circuit, and all flip-flops are resettable via signal RESETn.

Figure 6:
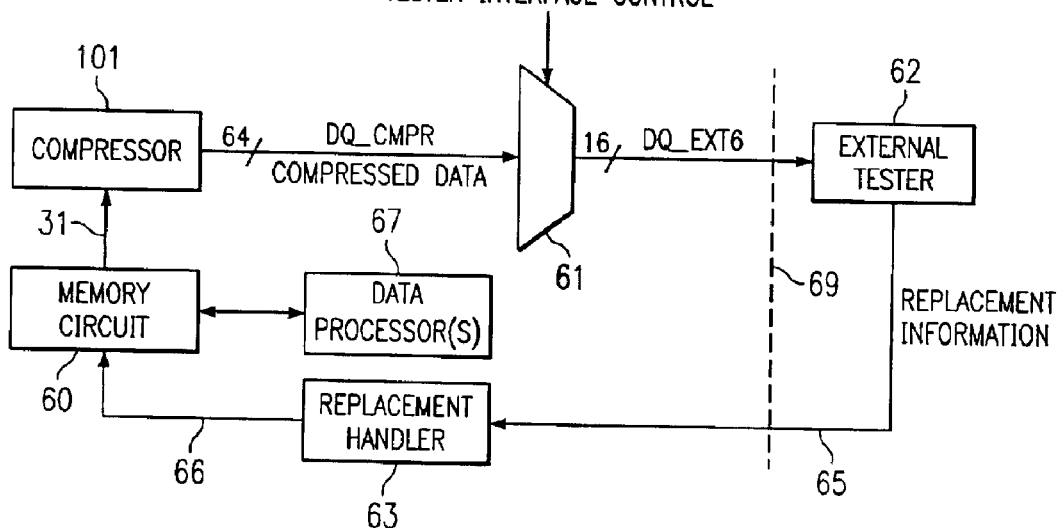
FIG. 6 diagrammatically illustrates an embedded memory testing arrangement according to the invention.

FIG. 6 diagrammatically illustrates an exemplary embedded memory circuit testing arrangement according to the invention. The global compressor circuit 101 of FIG. 1 receives data and address information from an embedded memory circuit 60 along with expected data information (not shown in FIG. 6). The compressor at 101 outputs the compressed failure bits to a multiplexer 61 which is controlled by a test interface control signal in conventional fashion to multiplex the 64 compressed failure bits onto 16 bits of the external tester interface. An external tester 62 (IC pin boundary is shown by broken line 69) utilizes the compressed failure bits to determine the optimal replacement strategy for the bitlines in the memory circuit 60. The external tester 62 then provides replacement information at 65 to an on-chip replacement handler 63. The replacement handler can use conventional techniques to produce at 66 control signaling which causes the memory circuit 60 to replace the bitlines associated with any of the 64 groups of K memory cells represented by the 64 compressed failure bits. For example, the external tester 62 may direct the replacement handler 63 to replace all bitlines associated with any group whose corresponding compressed failure bit is a logic one (indicating failure of at least one of the K cells in the group).

Also as shown in FIG. 6, the memory circuit 60 is coupled for bidirectional communication with one or more data processors 67 embedded within the same integrated circuit as the memory circuit 60, as is common in ASIC designs.

Figure 7:
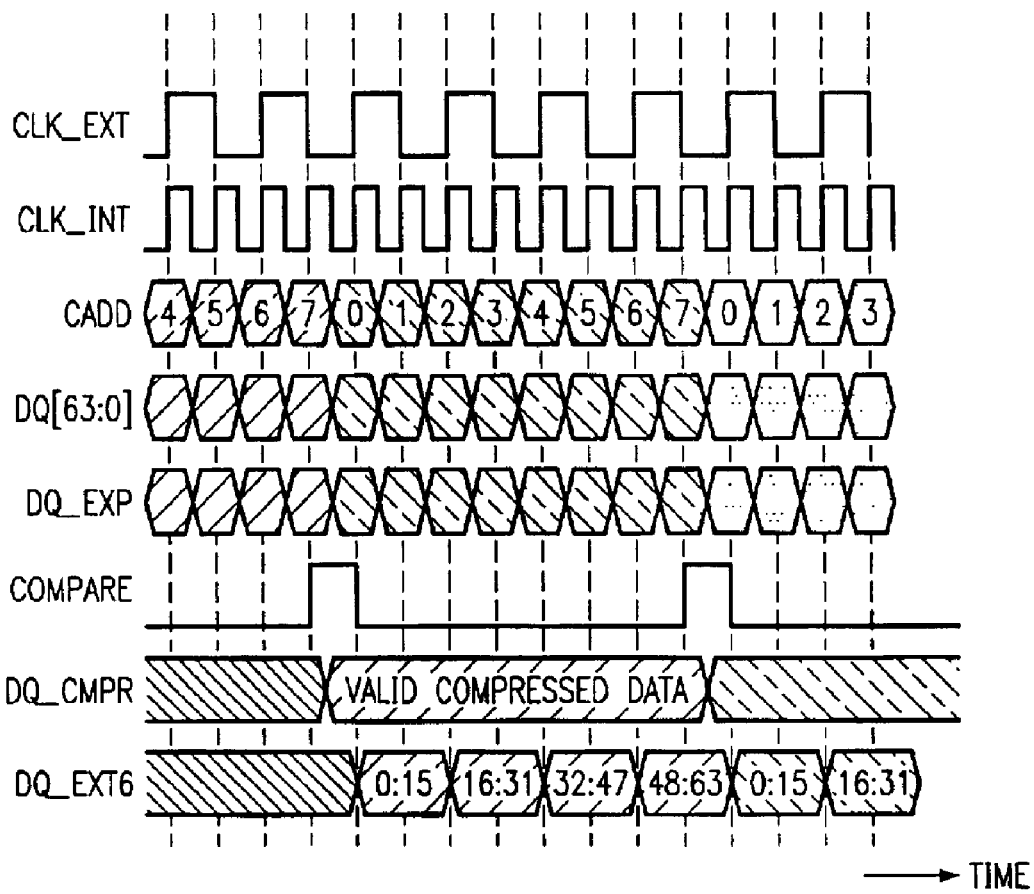
FIGS. 7 and 8 are timing diagrams which illustrate exemplary embedded memory testing operations according to the invention.

FIG. 7 is a timing diagram which illustrates exemplary operations that can be performed by the embodiments of FIGS. 3–6. In the example of FIG. 7, the frequency of the internal memory clock CLK_INT is twice the frequency of the external tester clock CLK_EXT. This permits the 64 bit data bus of the embedded memory circuit to be accessed eight times during the amount of time (four external tester clock cycles) required to multiplex 64 compressed failure bits (DQ_CMPR) onto the 16 bit external tester interface at DQ_EXT6. Thus, the example of FIG. 7 illustrates operation of the specific implementation shown in FIGS. 4 and 5, wherein K=8 and eight data latches 203 are provided for respectively storing the results of eight successive data/expected data compares. The COMPARE signal (see also FIG. 5) is active during every eighth cycle of CLK_INT to permit the output of comparator 204 (see FIGS. 4 and 5) to be latched at 206. The signal DQ_EXP represents the 64 expected data bits corresponding to the 64 data bits from the internal memory data bus DQ[63:0]. The signals illustrated in FIG. 7 are also labeled at selected points where they appear in FIGS. 3–6.

Figure 8:
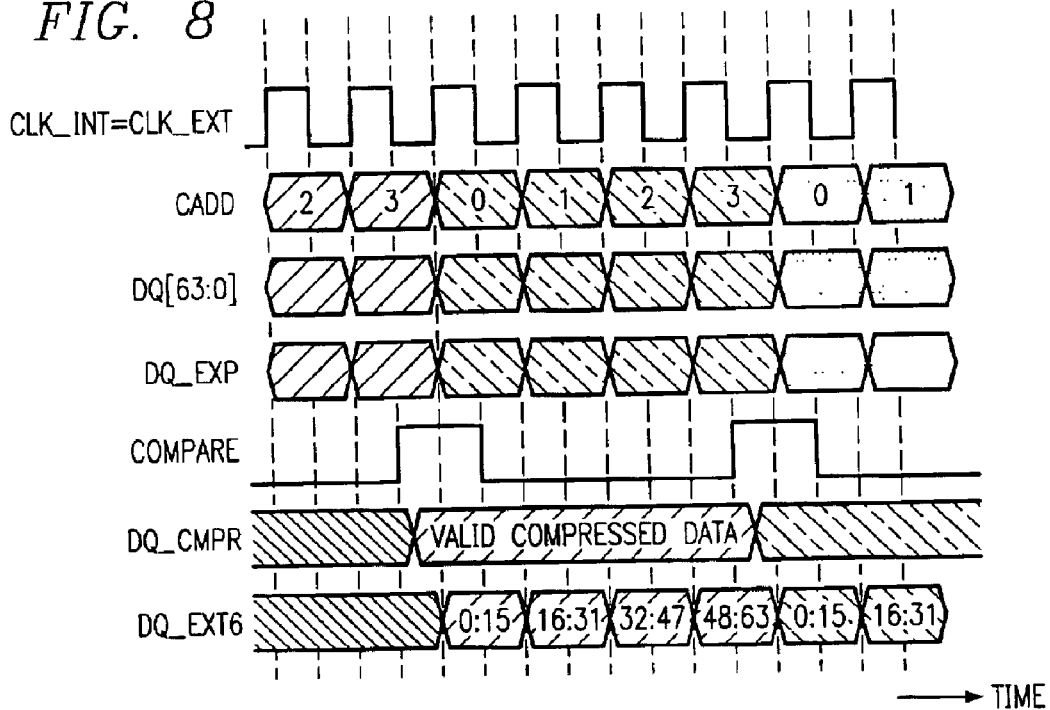

FIG. 8 is a timing diagram which illustrates further exemplary memory testing operations according to the invention. FIG. 8 is similar to FIG. 7, but in the example of FIG. 8, the internal memory clock CLK_INT has the same frequency as the external tester clock CLK_EXT, so the 64 bit internal memory data bus can be read four times in the amount of time required to multiplex 64 bits onto the 16-bit external tester interface. Thus, in this example, the compression factor K=4. For this example, the local compression circuits 102 of FIGS. 4 and 5 would require only a 4-way multiplexer 202 and four data latches 203, and only the least significant two bits of the column address CADD would be needed to control the multiplexer 202.

From the foregoing description, it can be seen that the compression factor K depends on the frequency relationship between the internal memory clock CLK_INT and the external tester clock CLK_EXT. At higher frequencies of CLK_INT, a higher compression factor K can be achieved, although a wider multiplexer and more data latches are required in each local compression circuit. As illustrated in FIGS. 7 and 8, the amount of time required for testing an embedded memory circuit is directly related to the compression factor K (K=8 in FIG. 7 and K=4 in FIG. 8). Thus, the operation of FIG. 7 reduces the test time by a factor of 8 and the operation of FIG. 8 reduces the test time by a factor of 4.

Figure 9:
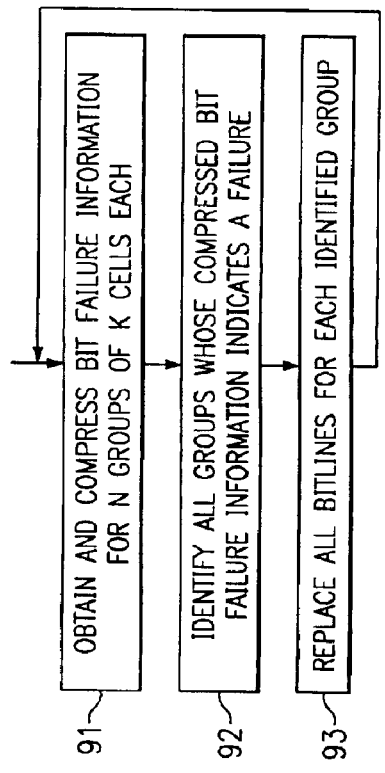
FIG. 9 illustrates exemplary operations which can be performed by the testing arrangement of FIG. 6.

FIG. 9 illustrates exemplary operations which can be performed by the embodiments of FIGS. 3–6. The exemplary operations of FIG. 9 assume a compression factor of K and an N-bit wide internal memory data bus. At 91, bit failure information is compressed for N groups of K memory cells each. At 92, all groups whose associated compressed bit failure information indicates a failure are identified. At 93, all bitlines of any group identified at 92 are replaced. Thereafter, the operations at 91–93 are repeated.

Although exemplary embodiments of the invention are described above in detail, this does not limit the scope of the invention, which can be practiced in a variety of embodiments.

What is claimed is:

1. A method of configuring a memory apparatus, comprising:

sequentially obtaining columns of test information for each of a predetermined number of columns of memory locations within the memory apparatus;

compressing the columns of test information according to associated groups of memory locations to produce a column of compressed test information; and based on the column of compressed test information, replacing a group of redundant memory circuits respectively associated with the predetermined number of columns of memory locations.

2. The method of claim 1, wherein said obtaining step includes comparing information stored in said memory locations to respectively corresponding information expected to be stored in said memory locations.

3. The method of claim 1, wherein the associated groups of memory locations is a group of neighboring memory cells in a DRAM array.

4. The method of claim 3, wherein the group of neighboring memory cells is a group of adjacent memory cells in a single row of the DRAM array.

5. The method of claim 1 wherein said compressing step includes storing the test information for each of the memory locations in a corresponding storage location.

6. The method of claim 5, wherein the test information for each of the memory locations of the group is a corresponding stored bit which is indicative of whether or not the associated memory location has failed a memory test.

7. The method of claim 6, wherein said compressing step includes logically combining the stored bits.

8. The method of claim 7, wherein said logically combining step includes logically ORing the stored bits.

9. The method of claim 1, wherein said obtaining step includes obtaining test information for each memory location of a plurality of groups of memory locations, said compressing step including compressing the test information respectively associated with each of the groups of memory locations to produce compressed test information.

10. The method of claim 9, including time division multiplexing the compressed test information for input to a tester that is physically separate from the memory apparatus.

11. The method of claim 1, wherein said replacing step includes replacing the redundant memory circuits only if the compressed test information indicates that at least one of the group of memory locations has failed.

12. The method of claim 1, wherein the group of memory locations is a group of neighboring memory cells in a DRAM array, said replacing step including replacing redundant bitlines respectively associated with the neighboring memory cells of the DRAM array.

13. An apparatus for configuring a memory, comprising:

an input for sequentially receiving columns of test information for each of a predetermined number of columns of memory locations within the memory;

a compression apparatus coupled to said input for compressing the columns of test information according to associated groups of memory locations to produce a column of compressed test information; and a replacement apparatus coupled to said compression apparatus and operable based on the compressed test information for replacing a group of redundant memory circuits respectively associated with the predetermined number of columns of memory locations.

14. The apparatus of claim 13, including a compare circuit having an output coupled to said input, having a first input for receiving information stored in said memory locations, and having a second input for receiving corresponding information expected to be stored in said memory locations, said compare circuit operable for comparing said stored information to said corresponding expected information to produce said test information at said output of said compare circuit.

15. The apparatus of claim 13, wherein said compression apparatus includes storage circuitry having a plurality of storage locations, said storage circuitry coupled to said input for storing the test information for each of the memory locations in a corresponding one of said storage locations.

16. The apparatus of claim 15, wherein said compression apparatus includes a routing apparatus connected between said input and said storage circuitry for routing the test information for each of the memory locations to its corresponding storage location.

17. The apparatus of claim 15, wherein the test information for each of the memory locations of the group is a corresponding bit which is indicative of whether or not the associated memory location has failed a memory test.

18. The apparatus of claim 17, wherein said compression apparatus includes logic coupled to said storage circuitry for logically combining the bits stored in said storage locations.

19. The apparatus of claim 18, wherein said logic is an OR gate.

20. The apparatus of claim 13, wherein said input is further for receiving test information for each memory location of a plurality of groups of memory locations, said compression apparatus operable for compressing the test information respectively associated with each of the groups of memory locations to produce compressed test information.

21. The apparatus of claim 20, including a multiplexer coupled between said compression apparatus and said replacement apparatus for time division multiplexing the compressed test information for input to said replacement apparatus.

22. The apparatus of claim 13, wherein said replacement apparatus is operable for replacing the redundant memory circuits only in response to an indication by the compressed test information that at least one of the group of memory locations has failed.

23. The apparatus of claim 22, wherein said replacement apparatus includes a tester responsive to said compressed test information for determining whether to replace the redundant memory circuits.

24. The apparatus of claim 13, wherein the group of memory locations is a group of neighboring memory cells of a DRAM array, and wherein the redundant memory circuits are bitlines respectively associated with the neighboring memory cells of the DRAM array.

\* \* \* \* \*